(12) United States Patent
Rhodehouse

(10) Patent No.: US 7,642,580 B2
(45) Date of Patent: Jan. 5, 2010

(54) IMAGER PIXEL STRUCTURE AND CIRCUIT

(75) Inventor: Robert R. Rhodehouse, Boise, ID (US)

(73) Assignee: Apitina Imaging Corporation, George Town (KY)

( * ) Notice: Subject to any disclaimer, the term of this patent is extended or adjusted under 35 U.S.C. 154(b) by 10 days.

(21) Appl. No.: 11/765,814

(22) Filed: Jun. 20, 2007

(65) Prior Publication Data

US 2008/0315263 A1 Dec. 25, 2008

(51) Int. Cl.
*H01L 31/08* (2006.01)

(52) U.S. Cl. .................. 257/292; 257/291; 257/290; 257/E32.053

(58) Field of Classification Search .......... 257/290, 257/291, 292, E31.053
See application file for complete search history.

(56) References Cited

U.S. PATENT DOCUMENTS

| | | | |
|---|---|---|---|
| 5,854,498 A | 12/1998 | Merrill | |
| 5,952,686 A | 9/1999 | Chou et al. | |
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,797,935 B2 * | 9/2004 | Kaya et al. ............. | 250/214.1 |
| 6,900,484 B2 | 5/2005 | Rhodes | |
| 6,984,537 B2 | 1/2006 | Fossum | |
| 7,009,227 B2 | 3/2006 | Patrick et al. | |
| 7,102,180 B2 | 9/2006 | Rhodes et al. | |
| 2005/0266597 A1 * | 12/2005 | Rhodes .................. | 438/48 |
| 2006/0108507 A1 * | 5/2006 | Huang .................. | 250/208.1 |
| 2006/0181622 A1 | 8/2006 | Hong | |
| 2006/0214201 A1 * | 9/2006 | Rhodes .................. | 257/292 |
| 2006/0231866 A1 * | 10/2006 | Henker et al. ............. | 257/213 |
| 2007/0012917 A1 | 1/2007 | McKee | |

FOREIGN PATENT DOCUMENTS

| | | |
|---|---|---|
| JP | 03-159170 | 7/1991 |
| JP | 03-159382 | 7/1991 |

OTHER PUBLICATIONS

PCT International Search Report for Application No. PCT/US2008/067239, dated Jan. 19, 2009.

* cited by examiner

*Primary Examiner*—Victor A Mandala
(74) *Attorney, Agent, or Firm*—Treyz Law Group; G. Victor Treyz

(57) ABSTRACT

An imager pixel and imaging device and system including an imager pixel for discharging a floating diffusion region are described. The imager pixel includes a photoconversion regions floating diffusion region, and a reset diode. A reset diode is coupled to the floating diffusion region and, when activated, discharges accumulated and collected charge from the photoconversion and the floating diffusion regions. Following successive accumulation, transfer and collection processes, the reset diode again discharges residual accumulated and collected charge from the photoconversion and the floating diffusion regions.

18 Claims, 5 Drawing Sheets

IMAGER PIXEL STRUCTURE AND CIRCUIT

FIELD OF THE INVENTION

Embodiments of the present invention relate generally to imaging circuits and structures and, more particularly, to an imager circuit and structure for resetting a charge collection region of an imager circuit.

BACKGROUND

Digital imagers have become popular features in various electronic devices. Typically, a digital imager includes an array of imager pixels or cells with each of the pixels including a photoconversion device (e.g. a photogate, photoconductor, or photodiode). In a Complementary Metal Oxide Semiconductor (CMOS) imager, a readout circuit is connected to each imager pixel which typically includes a source follower output transistor. The photoconversion device converts photons to electrons which are typically stored at a floating diffusion region connected to the gate of the source follower output transistor. A charge transfer device (e.g., a pass transistor) can he included for transferring charge from the photoconversion device, also known as a charge accumulation region, to the floating diffusion region, also known as a charge collection region. In addition, such imager pixels typically have a transistor for resetting the floating diffusion region to a predetermined charge level prior to charge transference. Furthermore, the output signal of the source follower transistor is gated by a row select transistor.

CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing patents are herein incorporated by reference in their entirety.

FIG. 1 shows one example of an imager pixel 10 of a conventional CMOS imager. A photodiode 12 or a charge accumulation region is comprised of regions 14, 16 which are opposite doping types, creating a p-n junction. When incident light strikes the photodiode 12, electron/hole pairs are generated in the p-n junction of the photodiode 12. The generated electrons are collected in the n-type region 16 of the photodiode 12. The photo charge is transferred from the initial charge accumulation region to a charge collection region, typically a floating diffusion region 18 via a transfer transistor 20, as illustrated in FIG. 1. The collected charge at floating diffusion region 18 is typically converted to a pixel output voltage VOUT by controlling the gate of a source follower transistor 22.

In operations, a row select transistor 24 is activated by row select signal RS and connects the imager pixel 10 to a column line 26. A reset transistor 28 is typically turned on by a reset signal RESET and the residual collected charge in the floating diffusion region 18 is reset to a predetermined voltage (egg. $V_{dd}$). Integration of light and accumulation of electrons at photodiode 12 is conducted at least during the reset period and prior to the application of a transfer gate voltage signal TX. The transfer gate voltage signal TX is then applied to the gate of the transfer transistor 20 to cause the accumulated charge in the photodiode 12 to transfer to the collection or floating diffusion region 18.

As illustrated, the collection or floating diffusion region 18 is electrically connected to the gate of a source follower transistor 22, the output of which is selectively applied to the column line 26 by row select transistor 24. The reset transistor 28 selectively resets the collection or floating diffusion region 18 to a predetermined voltage by coupling a voltage $V_{dd}$ to the collection or floating diffusion region 18 during a reset period which precedes or follows a charge accumulation or integration period.

While a four-transistor (4T) imager pixel design provides a separate reset transistor 28 to reset the collection or floating diffusion region 18 to a known potential, there is an ever increasing desire to minimize the number of transistors used in an imager pixel to reduce pixel cell size, increase pixel density in an array and increase the proportion (e.g., fill factor) of the charge accumulation region (e.g., photodiode) with the overall size of the imager pixel. Furthermore, there is also a further desire to simplify overall imager pixel design and fabrication complexity.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to he understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrates" in the following description, previous process steps may have been utilized to form regions or junctions in the base semiconductor structure or foundation. In addition, the semiconductor need not be silicon-based, but may be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, conventionally, fabrication of all pixels in an imager will proceed simultaneously in a similar fashion. Also, although the invention is described below showing one illustrative cross-sectional arrangement of the imager pixel as fabricated in a substrate, it should be apparent that many other arrangements are also possible. Also, as used herein in the description of the invention, the "n" and "p" designations, as in "n-type" and "p-type", are used in the common manner to designate donor and acceptor type impurities which promote electron and hole type carriers, respectively, as the majority carriers.

Figure 1:
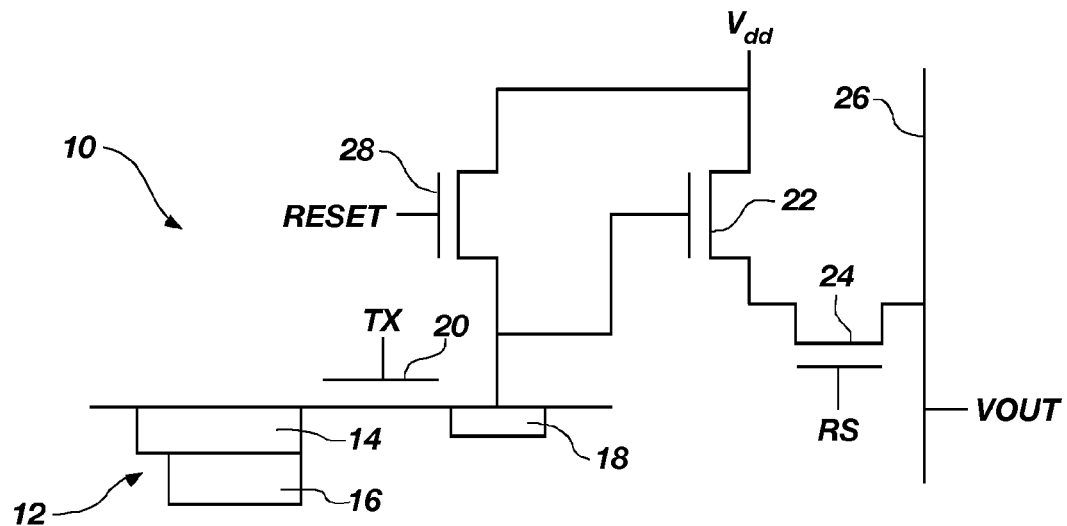
FIG. 1 illustrates a conventional CMOS imager pixel.
Figure 2:
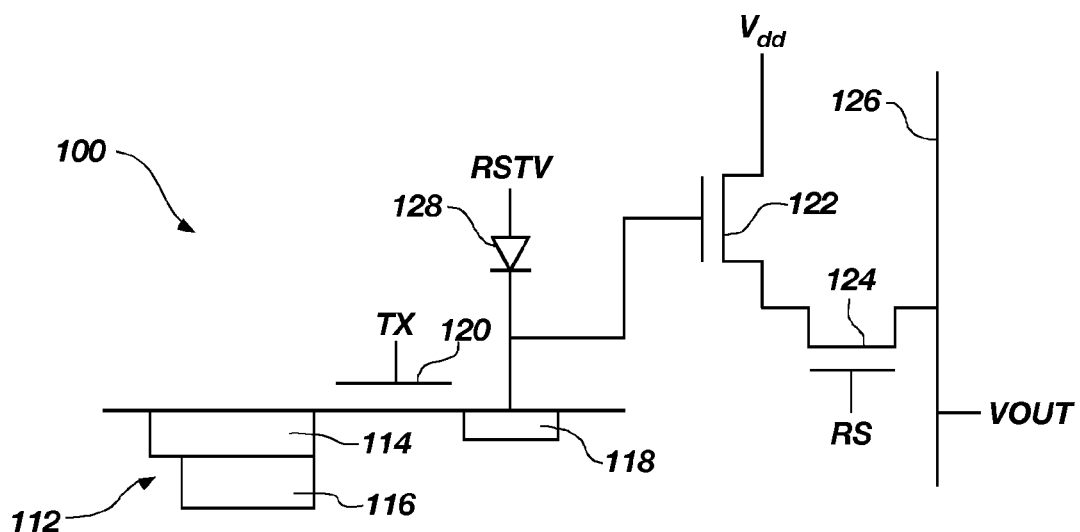
FIG. 2 illustrates an imager pixel of a CMOS imaging device, in accordance with an embodiment of the present invention.

FIG. 2 illustrates an imager pixel of a CMOS imaging device, in accordance with an embodiment of the present invention. An imager pixel 100 includes a charge accumulation region illustrated as a photodiode 112 comprised of regions 114, 116 which are opposite doping types, creating a p-n junction. As stated, when incident light strikes the photodiode 112, electron/hole pairs are generated in the p-n junction of the photodiode 112. The generated electrons are collected in the n-type region 116 of the photodiode 112.

It should be understood that the embodiments of the invention are applicable to imager pixels in any arrangement and orientation and for integration with other components of a semiconductor device. The embodiments may optionally include photogates, photoconductors, or other image-to-charge converting devices, in lieu of photodiodes, for initial accumulation of photo-generated charge.

During reading of the imager pixel 100, the accumulated charge moves from the initial charge accumulation region to a charge collection region, typically from a photodiode 112 to a floating diffusion region 118 via a transfer transistor 120. The collected charge at floating diffusion region 118 is typically converted to a pixel output voltage VOUT by controlling the gate of a source follower transistor 122. In operations, a row select transistor 124 is activated by row select signal RS and connects the imager pixel 100 to a column line 126.

A reset diode 128 is controlled by reset voltage signal RSTV and the residual collected charge in the floating diffusion region 118 is reset to a predetermined voltage (e.g. $V_{dd}$). Integration of light and accumulation of electrons at photodiode 112 is conducted at least during the reset period and prior to the application of a transfer gate voltage signal TX. The transfer gate voltage signal TX is then applied to the gate of the transfer transistor 120 to cause the accumulated charge in the photodiode 112 to transfer to the collection or floating diffusion region 118.

As illustrated, the collection or floating diffusion region 118 is electrically connected to the gate of a source follower transistor 122, the output of which is selectively applied to the column line 126 by row select transistor 124. The reset diode 128 selectively resets the collection or floating diffusion region 118 to a predetermined voltage by coupling a voltage $V_{dd}$ to the collection or floating diffusion region 118 during a reset period which precedes or follows the charge accumulation or integration period.

In the present embodiment, the imager pixel 100 utilizes the reset diode 128 to reset the collection or floating diffusion region 118 without requiring the additional area within the imager pixel for formation of a reset transistor as in conventional imager pixels. Utilizing a reset diode 128 enables the fill factor of the imager pixel to be increased as the proportion of the accumulation region to the entire imager pixel increases. The pixel output voltage VOUT generated from the source follower 122, couples via column line 126 to sample-and-hold (S/H) or other quantization circuitry (not shown in FIG. 2) for converting a quantity of collected charge into a storable digit value.

Figure 3:
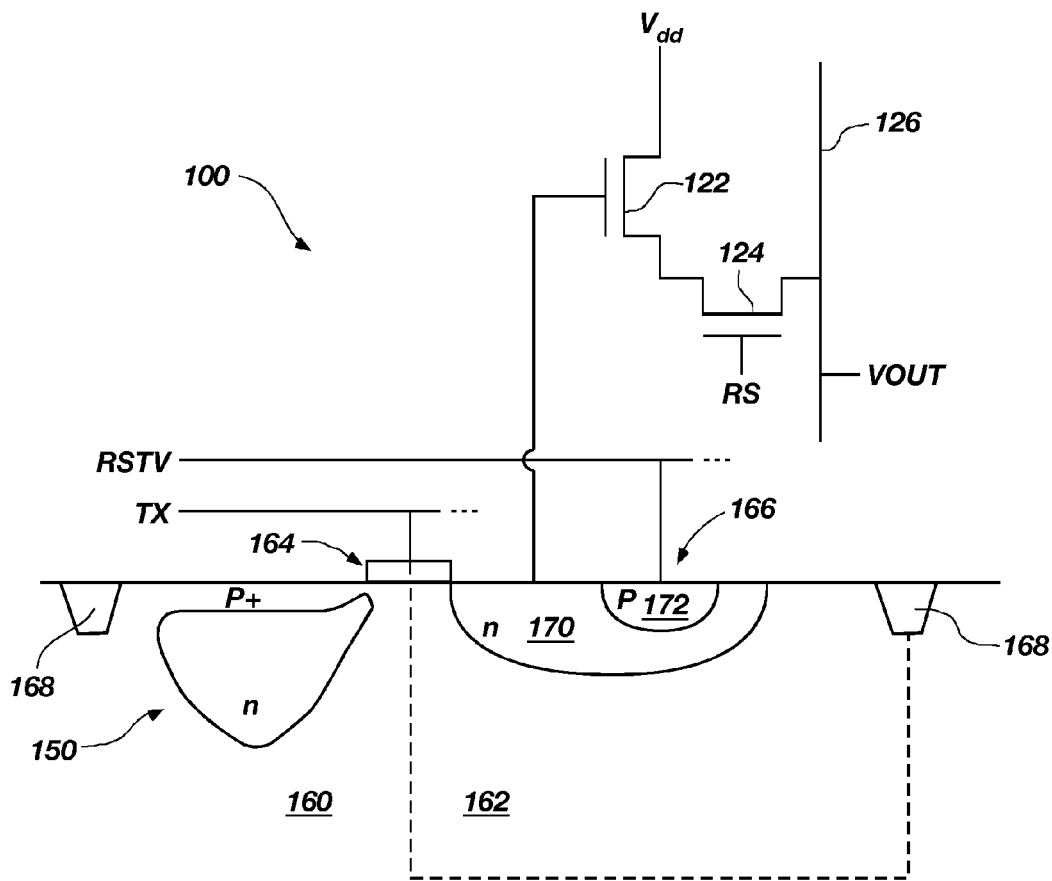
FIG. 3 is a cross-sectional diagram of the structure of the imager pixel, in accordance with an embodiment of the present invention.

FIG. 3 is a cross-sectional diagram of the structure of the imager pixel, in accordance with an embodiment of the present invention. An accumulation region such as a photodiode 150 is illustratively formed in a p-type substrate 160 which also has a more heavily doped p-type well 162. As stated, the accumulation region is illustratively a photodiode 150 and may be a p-n junction photodiode, a Schottky photodiode, or any other suitable photoconversion device. Other structures shown in FIG. 3 include a transfer transistor 164 and a reset diode 166. Shallow trench isolation (STI) regions 168 are also illustrated and are used for isolating imager pixels and floating diffusion region 170 from adjacent imaging pixels.

Floating diffusion region 170 is coupled to the gate of a source follower transistor 122, which receives the charge temporarily stored by the floating diffusion region 170 and provides an output signal based on the stored charge to a first source/drain terminal of a row select transistor 124. When the row select signal RS is asserted, the signal produced by the source follower transistor 122 is coupled to the column line 126 where it is further processed by sampling and processing circuits as further described below with reference to FIG. 5.

Reset diode 166 is formed as a p-type region 172 in the n-type floating diffusion region 170 and the reset diode 166 is activated by reset voltage signal RSTV during a reset phase of the imager pixel. When the reset diode 166 is activated, the p-n junction is forward-biased, facilitating the bleeding or depletion of collected charge from the floating diffusion region. Due to the $V_{th}$ of the diode, the floating diffusion region will discharge to a potential of the reset voltage signal RSTV-$V_{th}$. A specific example of signal voltages is further described below.

Figure 4A:
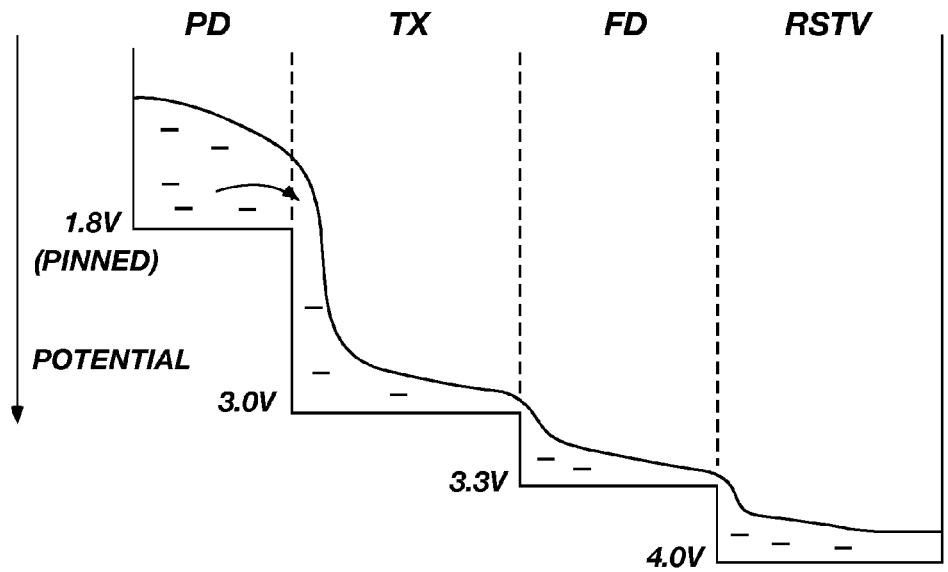
FIGS. 4A-4C illustrate potential energy diagrams of the imager pixel, in accordance with an embodiment of the present invention.
Figure 4B:
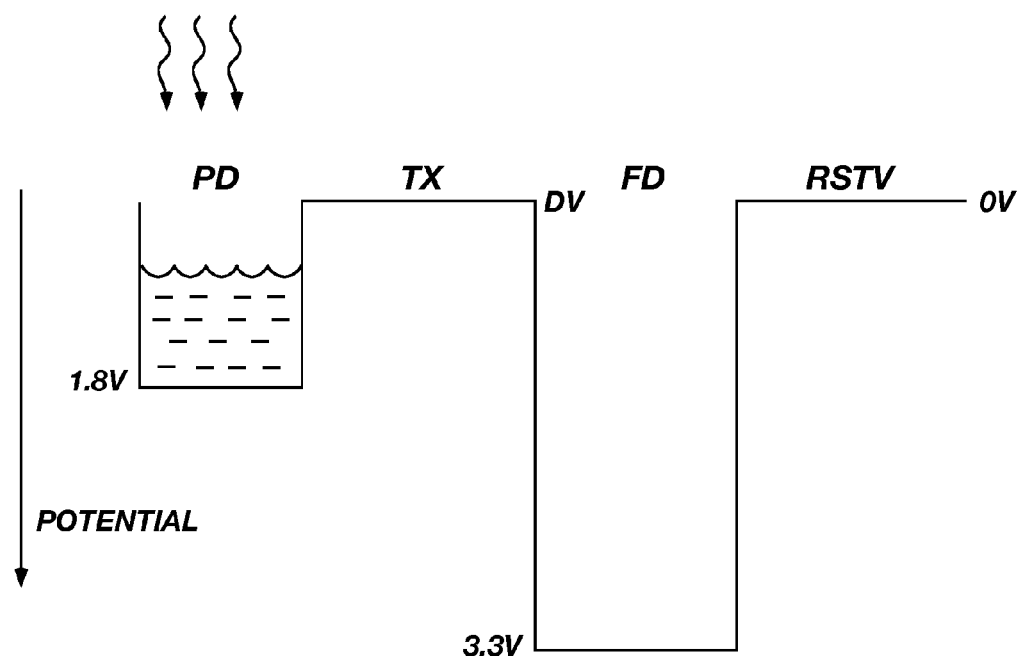
Figure 4C:
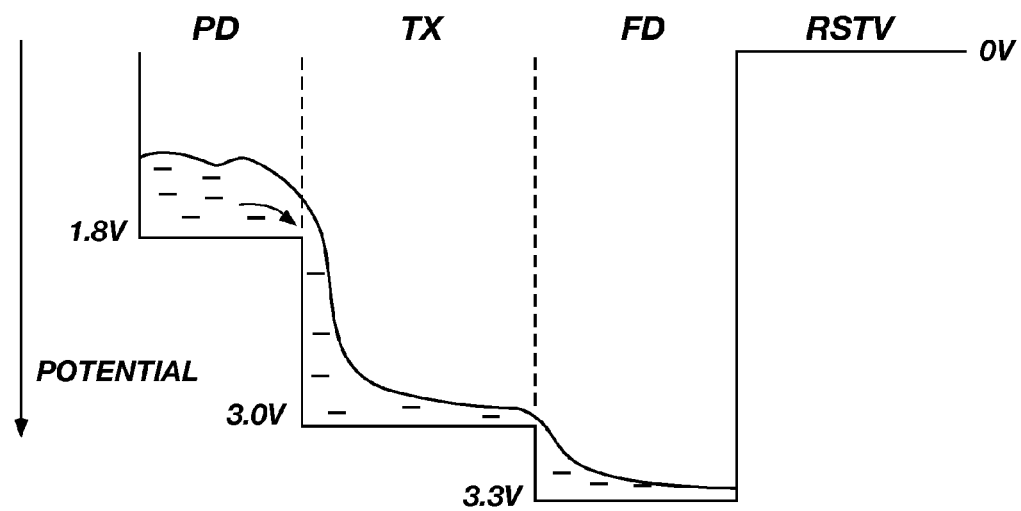

FIGS. 4A-4C illustrate potential energy diagrams of the imager pixel, in accordance with an embodiment of the present invention. Specifically, FIG. 4A illustrates potential energy diagrams during a reset of the imager pixel. According to the embodiment of the present invention, use of a reset diode enables a "soft reset" wherein the $V_{th}$ voltage drop across the reset diode generates a more gradual activation of the reset mechanism resulting in a reduction in overall noise for the imager pixel during the reset operation.

The reset phase of an imaging process allows the floating diffusion region to be reset or charge-depleted to a predetermined voltage before accumulated charge is transferred thereto from the photodiode. While the assertion pulse widths and timing of assertion of both the transfer gate voltage signal TX and reset voltage signal RSTV are determinable based upon the execution speed of the imaging device, both the transfer transistor 164 and the reset diode 166 are simultaneously asserted in order to provide a transfer path for the accumulated charge above the pinned voltage in the photodiode 150 to pass to the floating diffusion region 170 for resetting the photodiode and, the floating diffusion to the predetermined voltage through reset diode 166.

By way of example and not limitation, various signal levels are described which cause activation or deactivation of the various electrical structures. These levels are illustrative and other signal levels are also contemplated as a result of device sizing or other processing parameter variations. In the present photodiode reset illustration, $V_{dd}$ may be set, for example, at 3.3V with the reset voltage signal RSTV being asserted at 4.0V which is the $V_{dd}$+$V_{th}$ where $V_{th}$ is the threshold voltage across the reset diode 166. The transfer transistor 164 is activated by allowing the transfer gate voltage signal TX to be set to 3.0V resulting in the photodiode 150 being pinned at 1.8V, for example. Since the $V_{th}$ drop occurs across the reset diode 166, the reset process is a "soft reset" as illustrated in FIG. 4A with the photodiode charge being sequentially discharged through the transfer transistor 164, the floating diffusion region 170 and the reset diode 166. As stated, a "soft reset" results in improved noise reduction over an additional switching reset transistor.

FIG. 4B illustrates potential energy diagrams during integration or accumulation of charge in the photodiode of the imager pixel. The transfer transistor 164 is turned off by setting the transfer gate voltage signal TX at 0V and turning the reset diode 166 off by setting the reset voltage signal RSTV to 0V. During integration or accumulation of charge in the photodiode 150, the charge continues to accumulate while the floating diffusion region 170 was set to 3.3V during the reset process by the reset diode 166.

FIG. 4C illustrates potential energy diagrams during charge transfer from the photodiode to the floating diffusion region of the imager pixel. The transfer transistor 164 is turned on by setting the transfer gate voltage signal TX at 3V with the reset voltage signal RSTV set to 0V causing the reset diode 166 to remain off. Activation of the transfer transistor 164 allows the charge to flow from the photodiode 150 to the floating diffusion region 170. When charge is collected in the floating diffusion region, the source follower becomes activated in response thereto.

Figure 5:
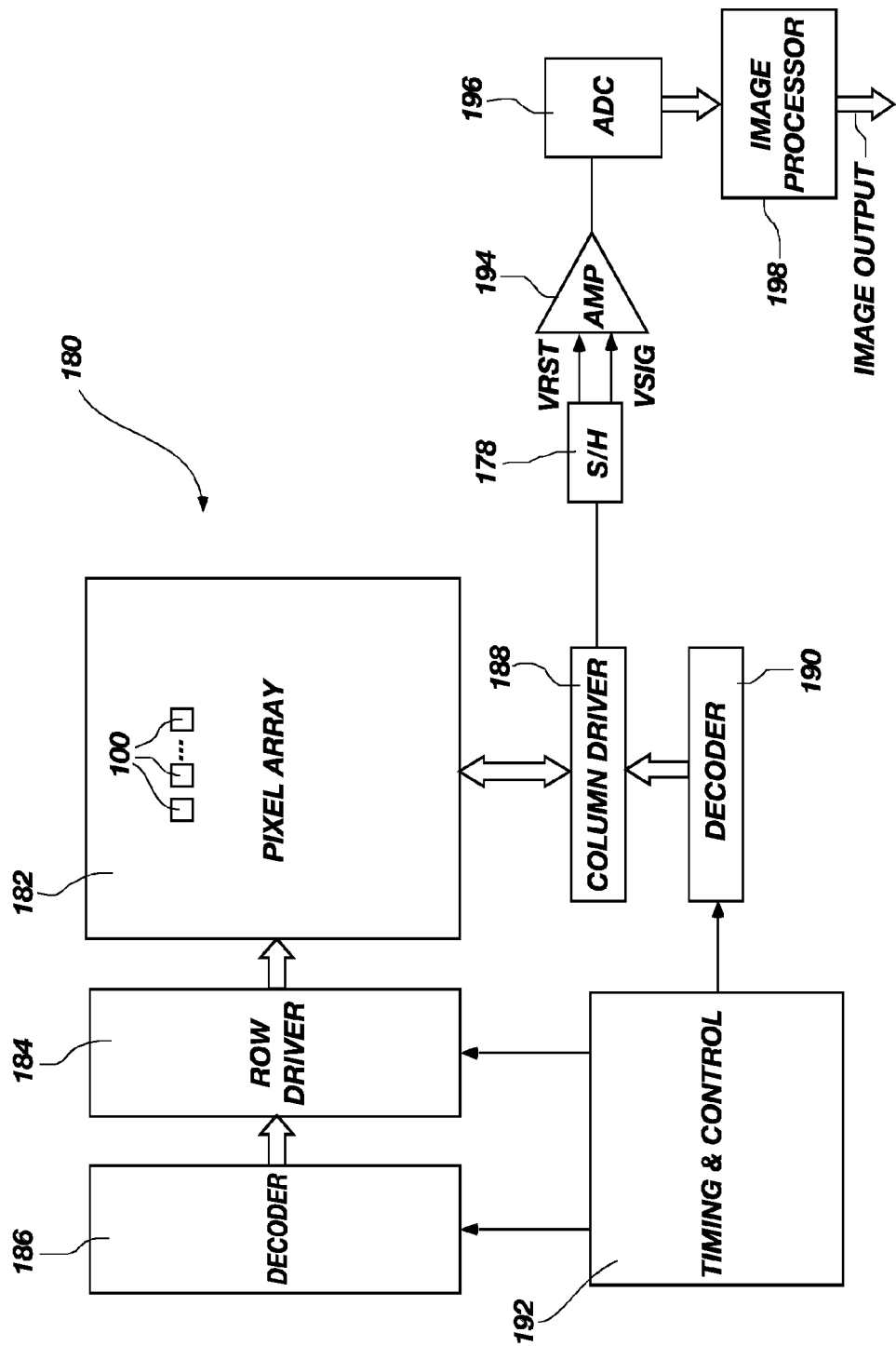
FIG. 5 illustrates a block diagram of a CMOS imaging device, in accordance with an embodiment of the present invention.

FIG. 5 illustrates a block diagram of a CMOS imaging device, in accordance with an embodiment of the present invention. CMOS imaging device 180 includes a pixel array 182 incorporating imager pixels 100 and is fabricated and functioning in the manner discussed above i relation to FIGS. 2-4C. Pixel array 182 includes a plurality of imager pixels arranged in columns and rows. The imager pixels of each row in pixel array 182 may be all turned on at the same time by a row select line and the pixels of each column may be selectively output by a column select line. A plurality of row and column lines is provided for the pixel array 182. The row lines are selectively activated by a row driver 184 in response to a row address decoder 186 and the column select lines are selectively activated by a column driver 188 in response to a column address decoder 190. Thus, a row and column address is provided for each imager pixel.

The CMOS imaging device 180 is operated by a control circuit 192 which controls resetting or depleting collected charge in imager pixels and transferring accumulated charge from the photodiode to the floating diffusion region. The control circuit 192 also controls the readout of image data by controlling the address decoders 186, 190 for selecting the appropriate row and column lines for imager pixel readout, and the row and column drivers 184, 188 which apply driving voltages to the drive transistors of the selected row and column lines.

A sample and hold (S/H) circuit 178 associated with the column driver 188 reads a pixel reset signal $V_{rst}$ and a pixel image signal $V_{sig}$ for selected pixels. A differential signal ($V_{rst}$–$V_{sig}$) is amplified by differential amplifier 194 for each pixel and is digitized by analog-to-digital converter 196 (ADC). The analog-to-digital converter 196 supplies the digitized pixel signals to an image processor 198 which forms a digital image. The image processor 198 may also determine the gain setting of the imaging device 180, which can be used to set the level of the voltage applied to the pixels' transfer gates.

Typically, the signal flow in the imaging device 180 would begin at the pixel array 182 upon receiving photo-input and generating a charge. The signal is output to a read-out circuit and then to an analog-to-digital conversion device. The digitized signal is transferred to a processor, then to the parallel-to-serial converter wherein the serialized signal may be output from the imaging device to external hardware.

Figure 6:
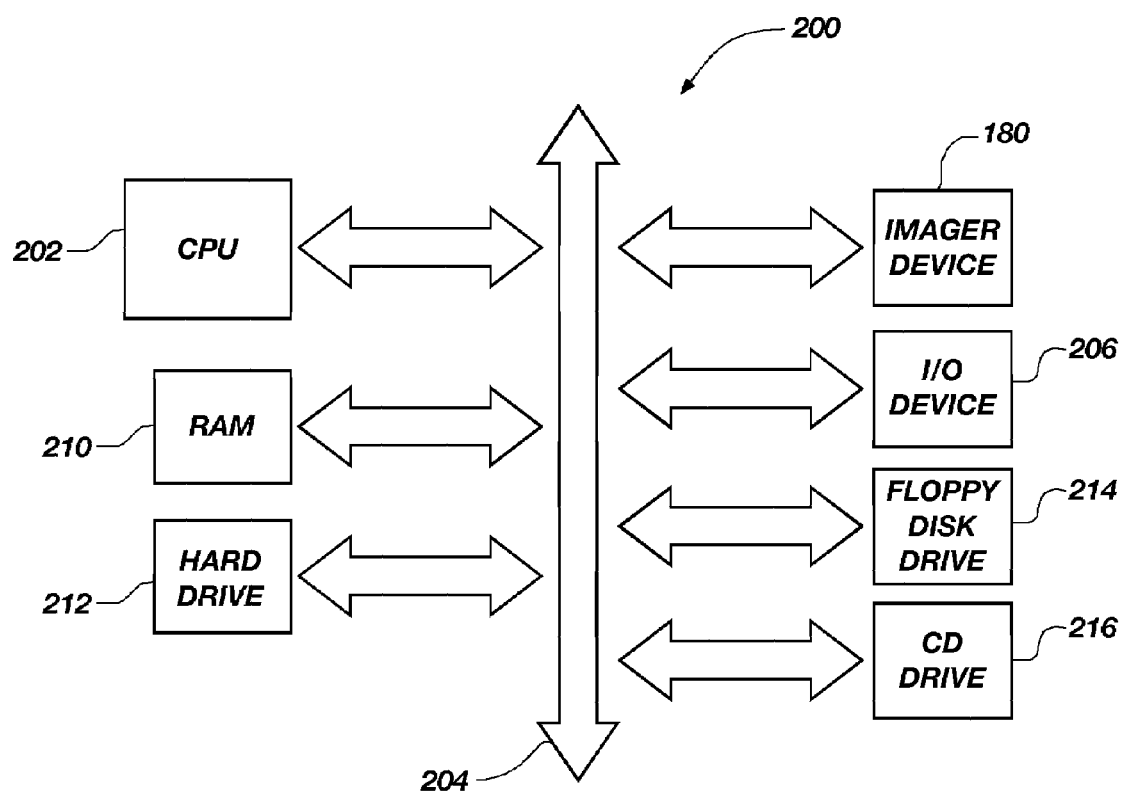
FIG. 6 illustrates an electronic imager system, in accordance wit an embodiment of the present invention.

FIG. 6 illustrates an electronic imager system, in accordance with an embodiment of the present invention. An electronic imager system 200 includes an imaging device 180 illustrated in FIG. 5 as an input device to the electronic imager system 200. The imaging device 180 may also receive control or other data from electronic imager system 200. Examples of processor based systems, which may employ the imaging device 180, include, without limitation, computer systems, camera systems, scanners, machine vision systems, vehicle navigation systems, video telephones, surveillance systems, auto focus systems, star tracker systems, motion detection systems, image stabilization systems, and others.

An electronic imager system 200 includes a central processing unit (CPU) 202 which communicates with various devices over a bus 204. Some of the devices connected to the bus 204 provide communication into and out of the imager system 200, illustratively including an input/output (I/O) device 206 and imaging device 180. Other devices connected to the bus 204 provide memory, illustratively including a random access memory (RAM) 210, a hard drive 212, and one or more removable memory devices, such as a floppy disk drive 214, compact disk (CD) or digital video disk (DVD) Fives 216, flash memory cards, etc. The imaging device 180 may be combined with a processor, such as a CPU, digital signal processor, or microprocessor, in a single integrated circuit.

The imager pixel arrays and devices described above may be formed at different sizes, for example, as imagers having arrays of various millions of imager pixels (megapixels). While the various embodiments described above include CMOS imager pixels with shallow buried photodiodes. The broad scope of the various embodiments includes other types of photoconversion elements in other configurations.

Embodiments of an imager pixel, device and system have been described herein. The imager pixel includes a photoconversion device, a charge collection region and a diode coupled to the charge collection region. The photoconversion device accumulates charge which is transferred to the charge collection region for quantification. The diode resets or selectively depletes the collected charge in the collection region prior to a successive accumulation and transfer process.

The imaging device includes a plurality of imager pixels with each of the pixels including a photoconversion region, floating diffusion region, and a reset diode. A reset diode is coupled to the floating diffusion region and, when activated, discharges accumulated and collected charge from the photoconversion and the floating diffusion regions. Following successive accumulation, transfer and collection processes, the reset diode again discharges residual accumulated and collected charge from the photoconversion and the floating diffusion regions. An imager system includes at least one I,O device coupled to an imaging device with the imaging device configured to include a reset diode for discharging transferred charge from a charge collection region of the imager pixel and indirectly from the charge accumulation region.

The processes and devices described above are merely illustrative of selected methods and devices out of many that may be used and produced according to embodiments of the present invention. The above description and drawings illustrate embodiments which provide significant features and advantages of the present invention. It is not intended, however, that the present invention be strictly limited to Me above-described and illustrated embodiments. Although the present invention has been shown and described with reference to particular embodiments, various additions, deletions and modifications that will be apparent to a person of ordinary skill in the art to which the invention pertains, even if not shown or specifically described herein, are deemed to lie within the scope of the invention as encompassed by the following claims.

What is claimed is:

1. An imager pixel, comprising:
 a photoconversion device for accumulating charge;
 a charge collection region switchably coupled to the photoconversion device; and
 a diode coupled to the charge collection region for selectively depleting the charge collection region prior to the photoconversion device being switchably coupled thereto.

2. The imager pixel of claim 1, wherein the photoconversion device is a photodiode.

3. The imager pixel of claim 1, wherein the diode is located in the charge collection region.

4. The imager pixel of claim 3, wherein the charge collection region is an n-type region and the diode includes a p-type region located in the charge collection region.

5. The imager pixel of claim 1, further comprising a transfer gate for switchably coupling the photoconversion device to the charge collection region.

6. The imager pixel of claim 5, wherein the diode is controllable during a reset phase of the imager pixel by a reset signal of greater voltage than a transfer signal controlling the transfer gate.

7. The imager pixel of claim 1, further comprising a source follower controllable by a potential in the charge collection region.

8. An imager pixel, comprising:
 a charge collection region configured to switchably receive accumulated charge from a photoconversion device; and
 a reset diode to deplete the accumulated charge from the charge collection region when activated.

9. The imager pixel of claim 8, wherein the charge accumulation region is an n-type region and the reset diode comprises a p-type implant in the charge accumulation region.

10. The imager pixel of claim 8, wherein the reset diode comprises a portion of the charge collection region.

11. The imager pixel of claim 8, wherein the charge collection region comprises a portion of a p-n junction of the reset diode.

12. An imaging device, comprising:
 a plurality of photoconversion regions;
 a plurality of floating diffusion regions;
 a plurality of transfer transistors for transferring charge from the plurality of photoconversion regions to the plurality of floating diffusion regions; and
 a plurality of reset diodes each of which discharges the collected charge from one of the floating diffusion regions.

13. The imaging device of claim 12, wherein the respective pluralities of photoconversion regions, floating diffusion regions, transfer transistors and reset diodes are configured in an array.

14. The imaging device of claim 12, wherein the photoconversion regions are pinned photodiodes.

15. The imaging device of claim 12, wherein each of the plurality of floating diffusion regions is an n-type region and comprises a portion of a p-n junction of a respective each of the plurality of reset diodes.

16. The imaging device of claim 12, wherein each of the plurality of reset diodes comprises part of a respective each of the plurality of floating diffusion regions.

17. The imaging device of claim 12, wherein each of the plurality of floating diffusion regions is an n-type region and a respective each of the plurality of reset diodes is a p-type implant therein.

18. The imaging device of claim 12, wherein during a reset phase of each of the plurality of floating diffusion regions, the respective each of the plurality of reset diodes is configured to be controlled by a reset signal of greater voltage than a transfer signal controlling a respective each of the plurality of transfer gates.

* * * * *